(12) United States Patent
Muellner et al.

(10) Patent No.: US 8,923,791 B2
(45) Date of Patent: Dec. 30, 2014

(54) RFID TRANSPONDER AND METHOD FOR OPERATING THE SAME

(75) Inventors: Ernst Muellner, Munich (DE); Carlo Peschke, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 455 days.

(21) Appl. No.: 13/314,576

(22) Filed: Dec. 8, 2011

(65) Prior Publication Data

US 2012/0161942 A1 Jun. 28, 2012

(30) Foreign Application Priority Data

Dec. 22, 2010 (DE) .......................... 10 2010 055 470

(51) Int. Cl.
- H04B 1/12 (2006.01)
- H04B 1/59 (2006.01)
- H03G 3/30 (2006.01)
- G07C 9/00 (2006.01)

(52) U.S. Cl.
CPC .. *G07C 9/00309* (2013.01); *G07C 2009/00793* (2013.01); *G07C 2009/00373* (2013.01); *H03G 3/3052* (2013.01)
USPC ...................... 455/249.1; 455/41.2; 455/151.2

(58) Field of Classification Search
USPC ............... 455/41.2, 63.1, 66.1, 67.11, 193.1, 455/226.1, 232.1, 574, 149.1, 234.1, 245.1
See application file for complete search history.

(56) References Cited

U.S. PATENT DOCUMENTS

| | | | | |
|---|---|---|---|---|
| 4,792,844 | A * | 12/1988 | Ohdate | 257/785 |
| 6,323,566 | B1 | 11/2001 | Meier | |
| 2009/0058601 | A1* | 3/2009 | Balachandran et al. | 340/10.1 |
| 2010/0141389 | A1* | 6/2010 | Hagl et al. | 340/10.1 |
| 2013/0225108 | A1* | 8/2013 | Akbari-Dilmaghani | 455/249.1 |

FOREIGN PATENT DOCUMENTS

| | | |
|---|---|---|
| DE | 102008060082 | 2/2008 |
| DE | 60223064 T2 | 7/2008 |
| DE | 102008060082 A1 | 6/2010 |

OTHER PUBLICATIONS

DE Search Report mailed May 14, 2012.

* cited by examiner

*Primary Examiner* — Blane J Jackson
(74) *Attorney, Agent, or Firm* — William B. Kempler; Frederick J. Telecky, Jr.

(57) ABSTRACT

An RFID transponder having an analog front end receiver having an attenuator coupled to receive an RF-signal from an antenna and to attenuate the RF-signal, an amplifier having a fixed amplifier gain and being coupled to receive and to amplify the attenuated RF-signal and a control unit coupled to control a gain of the attenuator, wherein the control unit is configured to control the attenuator gain in response to a level of the amplified RF-signal, the control unit is configured to have a plurality of predetermined states causing the attenuator to increase (step-up) or to decrease (step-down), its gain by a predefined step size.

13 Claims, 6 Drawing Sheets

FIG. 4

| STATE | \multicolumn{9}{c}{GAIN AND DEMODULATION CONTROL} | | |
|---|---|---|---|---|---|---|---|---|---|---|
| | PRECHARGE | UP | DOWN | SMALL | MEDIUM | BIG | en_att | fast_amp | EOB | RUN |
| 0a | 0 | 0 | 0 | 0 | 0 | 0 | 0 | 0 | 1 | 0 |
| 0b | 1 | 0 | 0 | 0 | 0 | 1 | | 1 | 1 | 0 |
| 1 | 0 | 0 | 0 | 0 | 0 | 1 | | 1 | 1 | 0 |
| 2,3 | 0 | 0 | 1 | 0 | 0 | 1 | | 1 | 1 | 0 |
| 4-7 | 0 | 1 | 0 | 0 | 0 | 1 | | 1 | 1 | 0 |
| 8-11 | 0 | 1 | 1 | 0 | 1 | 0 | | 1 | 1 | 0 |
| 12-15 | 0 | 0 | 0 | 0 | 1 | 0 | | 1 | 1 | 0 |
| 25 | 0 | 0 | 1 | 1 | 0 | 0 | | 0 | 1 | 0 |
| 26 | 0 | 0 | 1 | 1 | 0 | 0 | | 0 | 1 | 0 |
| 27 | 0 | 1 | 0 | 1 | 0 | 0 | | 0 | 1 | 0 |
| 28 | 0 | 0 | 0 | 1 | 0 | 0 | | 0 | 1 | 1 |
| 29 | 0 | 0 | 0 | 1 | 0 | 0 | | 0 | 1 | 1 |
| 30 | 0 | 0 | 1 | 1 | 0 | 0 | | 0 | 0 | 1 |
| 31 | 0 | 1 | 0 | 1 | 0 | 0 | 1 | 0 | 0 | 1 |

RFID TRANSPONDER AND METHOD FOR OPERATING THE SAME

CROSS-REFERENCE TO RELATED APPLICATIONS

This patent application claims priority from German Patent Application No. 10 2010 055 470.7, filed Dec. 22, 2010, which is incorporated herein by reference in its entirety.

FIELD OF THE INVENTION

The invention relates to an RFID transponder and to a method for operating the same. The invention relates to a vehicle keyless entry system comprising a base station and the RFID transponder.

BACKGROUND OF THE INVENTION

RFID transponders are used in numerous applications such as identification or passive keyless entry systems. A field of application is a road vehicle keyless entry system. Such an entry system uses RF-signals in the frequency range of about 120 kHz to 140 kHz. Typically, a base station transmitter that is located in the car sends a short sequence of symbols as digitally modulated RF-signals. A known method of modulation is amplitude shift keying. A mobile transponder that is typically a part of a car key receives these RF-signals and if the detected pattern matches the expected value, it answers using UHF frequencies that are typically in the band of 315 MHz in the USA and 433 MHz in Europe. After the initial sequence, more information is exchanged between the base station and the transponder according to an authentication protocol using either the low frequency RF band or the UHF band. When the transponder has successfully authenticated itself to the base station, the car doors may be unlocked and engine start may be allowed. A typical transponder system for such a remote keyless entry system is known from U.S. Pat. No. 6,323,566 B1, filed on Oct. 10, 1996.

The most valuable and limited resource in any RFID transponder is power or energy that may be provided by a battery. For reasonable battery lifetime, the transponder must consume very little power when listening to an initial sequence. When the initial sequence is detected, the transponder activates the UHF transmitter and the cryptographic protocol circuitry. In this activated state, the RFID transponder consumes much more power. The starting up of the transponder is also called a wake up, the initial sequence is typically referred to as a wake up pattern.

FIG. 1 shows a schematic layout of an RFID transponder 1 comprising at least one receiver channel 6 having an analog front end 2 and a digital wake up pattern detector 4 for detecting a wake up pattern. Typically, three receiver channels 6, one for every direction in space, are build in a 3D receiver for a mobile transponder. The front end 2 receives an RF-signal RF from a suitable antenna 12. The automatic gain control AGC amplifies the signal RF that is subsequently demodulated by a demodulator 8. A bit detector 10 that is itself not a part of the analog front end 2 but interacts with it, provides a data signal D to the wake up pattern detector 4. Upon successful detection of a wake up pattern in the data signal D, the wake up pattern detector 4 sends a wake signal W to the further parts 12 of the RFID transponder 1. Inter alia, a subsequent bit detector is started and evaluates the received ASK information in a demodulation mode and according to the used symbol coding.

An RFID transponder with improved wake up pattern detection is known from DE 10 2008 060 082 filed on Dec. 2, 2008.

SUMMARY OF THE INVENTION

It is a general object of the invention to provide an RFID transponder, a method for operating the same and a vehicle keyless entry system comprising an RFID transponder, wherein the RFID transponder is improved with respect to its power consumption.

According to an aspect of the invention, an RFID transponder having an analog front end receiver is provided. The front end receiver comprises an attenuator coupled to receive an RF-signal from an antenna and to attenuate the RF-signal. The analog front end further comprises an amplifier having a fixed amplifier gain and being coupled to receive and to amplify the attenuated RF-signal. Further, the RFID transponder comprises a control unit coupled to control the gain of the attenuator, wherein the control unit is configured to control the attenuator gain in response to a level of the amplified RF-signal.

The amplifier has a fixed amplifier gain. Accordingly, the overall gain of the amplifier plus the attenuator is determined by an attenuation factor of the attenuator only. The lower the attenuation factor the higher the overall amplifier gain and vice versa. The term "attenuator gain" is the reciprocal attenuation factor and thereby reflects the overall gain of the amplifier plus the attenuator. The higher the attenuation factor the higher the overall gain of the amplifier plus the attenuator and vice versa.

The control unit is further configured to have a plurality of predetermined states causing the attenuator to increase or to decrease its gain by a predefined step size. The states causing the attenuator to increase the attenuator gain by a certain step size are referred to as up-states. Correspondingly, the states causing the attenuator to decrease the attenuator gain by a certain step size are referred to as down-states. Further, the single states are referred to as a step-up and step-down, respectively.

According to an aspect of the invention, the step size for a step-up may be equal to or smaller than the step size of a step-down. The control unit of the RFID transponder is further configured to switch, upon reaching or exceeding a predetermined threshold value, from a first to a second state having a smaller step size. The second state may further cause the attenuator to change its gain such that the slope of the RF-signal inverts. The control unit is configured to switch, upon reaching the predefined threshold again, into a third state that causes the attenuator to change the prefix of the gain.

In an empirical analysis, it has been discovered that the RFID transponder according to the invention is very tolerant to interference. It has a lower error rate when switching from a sleep mode to the wake up pattern detection mode. In other words, it does least often wrongly switch to the wake up pattern detection mode when—in reality—no wake up pattern has arrived. Accordingly, less power is wasted for untrue startup sequences that do not lead to a successful detection of a wake up burst. The RFID transponder is further robust against various interferences such as strong burst noise, pure random noise or a permanent interfering carrier.

According to an aspect of the invention, the RFID transponder comprises a control unit having classified states. The states may be classified in three groups, namely a first, a second and a third group. The first and second group comprising at least one step-up and a step-down having a big or a medium step size. The third group comprising at least a step-up and a step-down both having a small step size. Further, for a medium or a big step-down, the step size is bigger than for a step-up. For a small step, the step size for a step-up is equal to the step size of step-down.

According to another aspect of the invention, the step size of a big step-down is equal to: twice the step size of a big step-up, four times the step size of a medium step-down, eight times the step size of medium step-up and sixteen times the step size of a small step-up or step-down. The given ratios between the step sizes lead to a binary search algorithm that gives the fastest settling. However, for a given maximum oscillation of the RF-signal level and a given input dynamic range, the number of the required step sizes may be higher than the five step sizes mentioned above. However, this would lead to a more complex control unit. Further, the maximum step size is limited by the speed of the rectifier and peak detector. Empirically, it was found that the above-mentioned ratios between the different step sizes give a good tradeoff between the settling time and an acceptable complexity of the control unit. However the ratio of the step size may also deviate from the above-mentioned factor of two, while also taking into account reasons like complexity of the control unit and speed limitations. Further, the factor between the step sizes may be chosen below a factor of two for big steps due to speed limitations. On the other hand, the factor may be chosen greater then two for small and/or medium step sizes. This leads to more steps but results in a better accuracy of the gain control.

In another embodiment, the RFID transponder comprises a peak detector coupled to detect a peak level of the amplified RF-signal. The peak detector further communicates the peak level to the control unit, wherein the peak detector has a predetermined high and low detection speed. The control unit is further configured in that the states of the third group cause the peak detector to work at a low detection speed. The third group of states comprises step-up and step-down having a small step size. The attenuator gain is changed very little. Accordingly, the amplified RF-signal will also change very moderately. This allows the peak detector to be set at a low detection speed.

According to another embodiment of the invention, the second group of states comprises at least two subgroups of states, wherein each subgroup comprises at least a step-up and a step-down. The first sub-group comprises step-up and step-down states having a big step-size, while the second subgroup comprises step-up and step-down states having a medium step size. The control unit is further configured to activate a step-down before activating a step-up, upon wakeup of the RFID transponder. According to embodiment of the invention, the control unit is further configured to activate the states having a big step size before activating states having a medium step size, again upon wakeup of the RFID transponder. The two aforementioned embodiments provide a fast settlement of the amplifier gain upon wakeup of the RFID transponder.

Further, the control unit may comprise an attenuator controller and a finite state machine for storing the plurality of states and for controlling the control unit by the respective states.

According to another aspect of the invention, a vehicle keyless entry system is provided. This system comprises an in-vehicle base station and a mobile unit comprising an RFID transponder according to the invention.

According to yet another aspect of the invention, a method of operating an RFID transponder having an analog front end receiver is provided. The method comprises the steps of: receiving an RF-signal from an antenna and attenuating the received RF-signal at the attenuator, amplifying the attenuated RF-signal with an amplifier having a fixed amplifier gain, controlling a gain of the attenuator with a control unit. The attenuator gain is controlled in response to a level of the amplified RF-signal, the attenuator gain is increased (step-up) or decreased (step-down) by a predefined step size Same definitions of the terms "step-up" and "step-down" that have been given for the RFID transponder apply to the method of operating an RFID transponder.

Further, the step size for increasing the attenuator gain is equal to or smaller than the step size for decreasing the attenuator gain and upon reaching or exceeding a predefined threshold value, the step size is decreased and the attenuator gain is changed such that the slope of the RF signal inverts. Upon reaching the predefined threshold again, the prefix of the amplifier gain is inverted.

Same or similar advantages mentioned for the RFID transponder apply to the method for operating the same.

According to another aspect of the invention, an RFID transponder having an analog front end receiver for receiving a wake up pattern comprising a first and a second part, concatenate to each other, is provided. The RFID transponder further comprises a wake up pattern detector having a first and a second stage, wherein the first stage has a lower power consumption compared to the second stage. The power consumption of the two stages is compared in its active state, respectively. The first stage is configured to detect the first part of the wake up pattern and, upon detection, to activate the second stage of the wake up pattern detector.

The power consumption of the RFID according to the invention is minimized. The energy for powering up the second stage of the wake up pattern detector is saved if detection of the first part of the wake up pattern fails.

According to another aspect of the invention, an RFID transponder is provided that, upon failed detection of the first part of the wake up sequence, is configured such that the wake up pattern detector returns to a sleep mode. Further advantageously, upon activation of the second part of the wake up pattern detector and failed detection of the second part of the wake up pattern, the wake up pattern detector is configured to deactivate its second stage and to leave the first stage activated.

In another embodiment of the invention, an RFID transponder is provided having an analog front end receiver according to one of the embodiments of the invention and further comprising a wake up pattern detector according to one of the embodiments of the invention.

According to another aspect of the invention, a method of operating an RFID transponder having a front end for receiving a wake up pattern having a first and a second part concatenate to each other and a wake up pattern detector comprising a first and a second stage is provided. The first stage has a lower power consumption compared to the second stage, the method comprises the steps of: detecting the first part of the wake up pattern at the first stage and, upon detection, activating the second stage of the wake up pattern detector.

Same or similar advantages given for RFID transponder apply to the method for operating the same.

Further aspects of the invention will appear from the appending claims and from the following detailed description given with reference to the appending drawings.

BRIEF DESCRIPTION OF DRAWINGS

FIG. 4 is a table of the states known from the state diagram of FIG. 3;

DETAILED DESCRIPTION OF EXAMPLE EMBODIMENTS

Figure 2:
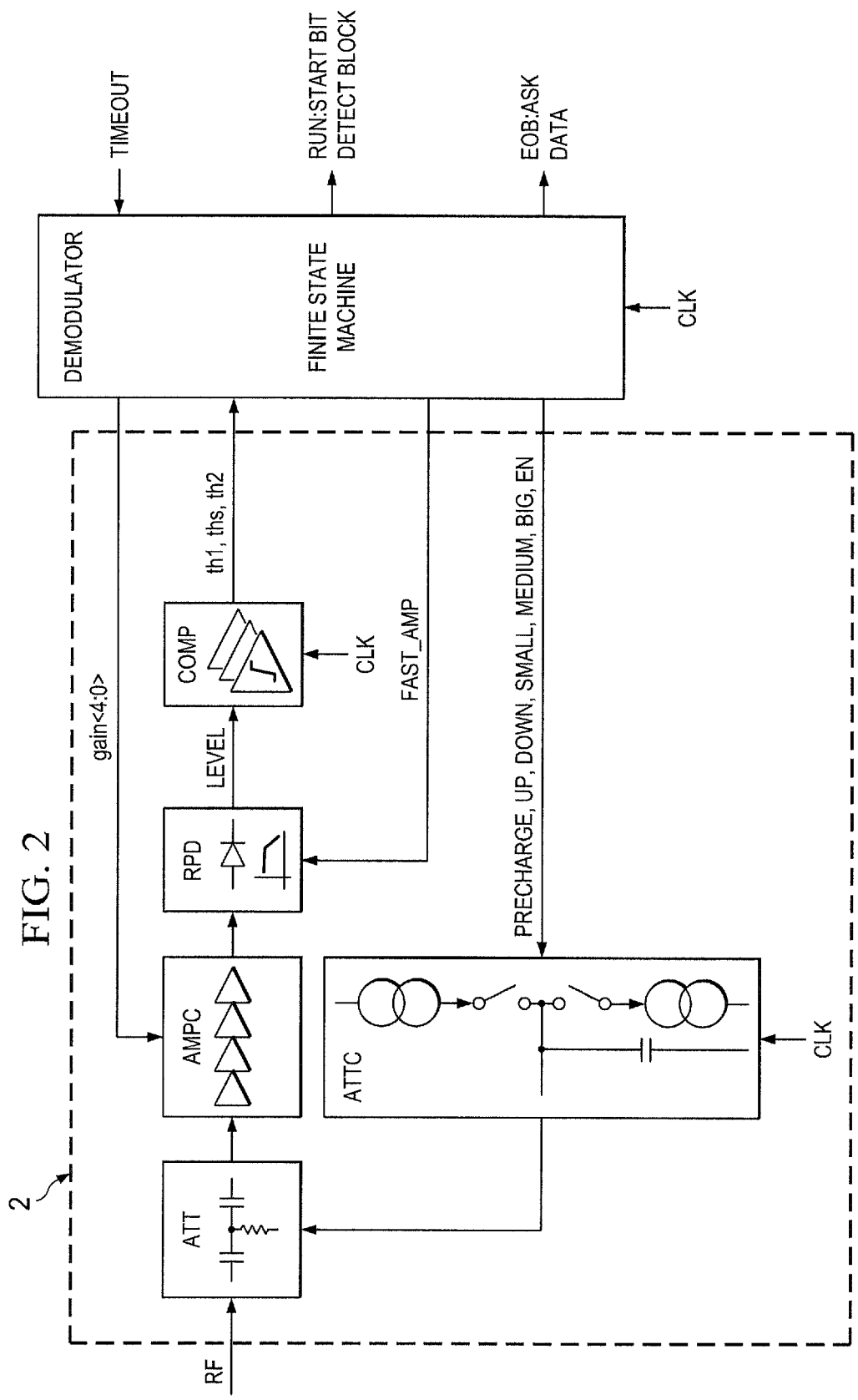
FIG. 2 is a simplified circuit diagram for a receiver channel that is controlled by a finite state machine.

FIG. 2 is a simplified circuit diagram for an analog front end 2 is a simplified circuit diagram for an analog front end 2 and a digital finite state machine FSM of an RFID transponder. An RF-signal RF that is received by a suitable antenna is coupled to an attenuator ATT. The attenuated signal is subsequently coupled to an amplifier chain AMPC that is working with a fixed amplification gain. The attenuation factor of the attenuator ATT is controlled by an attenuator controller ATTC. The overall amplification gain of the RF-signal is controlled by controlling the attenuation factor of the attenuator ATT. Since the amplification factor of the amplifier chain AMPC is constant, the total gain for the RF-signal solely depends on the attenuation factor that is the reciprocal value of the amplifier gain. In the following, the term attenuator gain will be used for this reciprocal attenuation factor that is further proportional to the overall gain of the RF-signal. Accordingly, the gain of the amplifier chain is set to a fixed level of 4:0. Gain<4:0> means that this is a digital signal of 5 bits, gain<4> being the most significant bit and gain<0> the least significant bit. With these 5 bits the gain can be adjusted in 32 steps.

This gain setting determines the minimum RF level required for wake up and is usually fixed during operation. Specification of the amplifier gain is in logarithmic form. The amplified signal is further coupled to a rectifier and peak detector RPD that detects a maximum amplitude of the amplified RF-signal. The level of the maximum amplitude is communicated to a comparator COMP that decides whether the respective level exceeds one of the threshold values TH1, THS or TH2. The respective information is communicated to the finite state machine FSM. The signals th1, ths and th2 that are communicated to the finite state machine FSM, indicate that the respective level TH1, THS and TH2 is reached or exceeded by the RF signal.

The threshold values TH1, THS and TH2 are arranged to each other in ascending order, wherein TH2 is smaller than THS that is in turn smaller than TH1. Preferably, TH2 is approximately equal to 0.7 times THS and TH1 is approximately equal to 1.6 times THS. Preferably, THS is the target output level of the amplifier, TH2 is the demodulation threshold and TH1 indicates that a strong signal has arrived.

The finite state machine FSM receives the signals th1, ths, th2 indicating the level of the RF-signal. The digital finite state machine FSM outputs a signal fast_amp to the rectifier and peak detector RPD. This signal sets the rectifier and peak detector RPD to a predetermined fast or slow mode. Further, the finite state machine FSM outputs signals: precharge, up, down, small, med, big, en_ATT to the attenuator controller ATTC. The signal precharge causes the attenuator controller ATTC to pre-charge or to set the attenuation gain up or down in case of the signal up or down. The signals: small, med, big indicate whether a small, medium or big step-up or step-down is commanded. The signal en_ATT is the enable signal for the ATTC block. If it is "low" the attenuator is in power down (no power consumption, but output is undefined). "High" puts it in operating mode. "Precharge" should be set "high" for a short time after "en_att" goes "high" to bring the output of ATTC to the optimal voltage for starting the regulation loop. Further, the finite state machine communicates the signals EOB and ASK data to the further parts of the RFID transponder. A run signal that starts a bit detection in the ASK signal by the following bit detection block. The finite state machine FSM as well as the comparator COMP and the attenuator controller ATTC are clocked with a clock signal CLK. This causes the whole system to check the level of the RF-signal in every clock cycle. The gain of the amplifier chain is controlled by the signal gain(4:0). In the following, an example wake up sequence for an RFID transponder according to an embodiment of the invention will be explained by making reference to FIG. 3 that is a state diagram for the finite state machine of FIG. 2 that is further a preferable control unit according to an embodiment of the invention. FIG. 4 is an example table showing the states of the finite state machine FSM. In absence of an RF input signal, the finite state machine FSM remains in state 0a which is the state with the lowest power consumption and the maximum gain (see FIG. 3). When an RF-signal is detected and the signal exceeds the threshold value TH2, the finite state machine FSM changes to state 0b as it is indicated by a respective arrow th2. If TH2 is not exceeded, indicated by the arrow !th2, the finite state machine FSM remains in state 0a.

Figure 5:
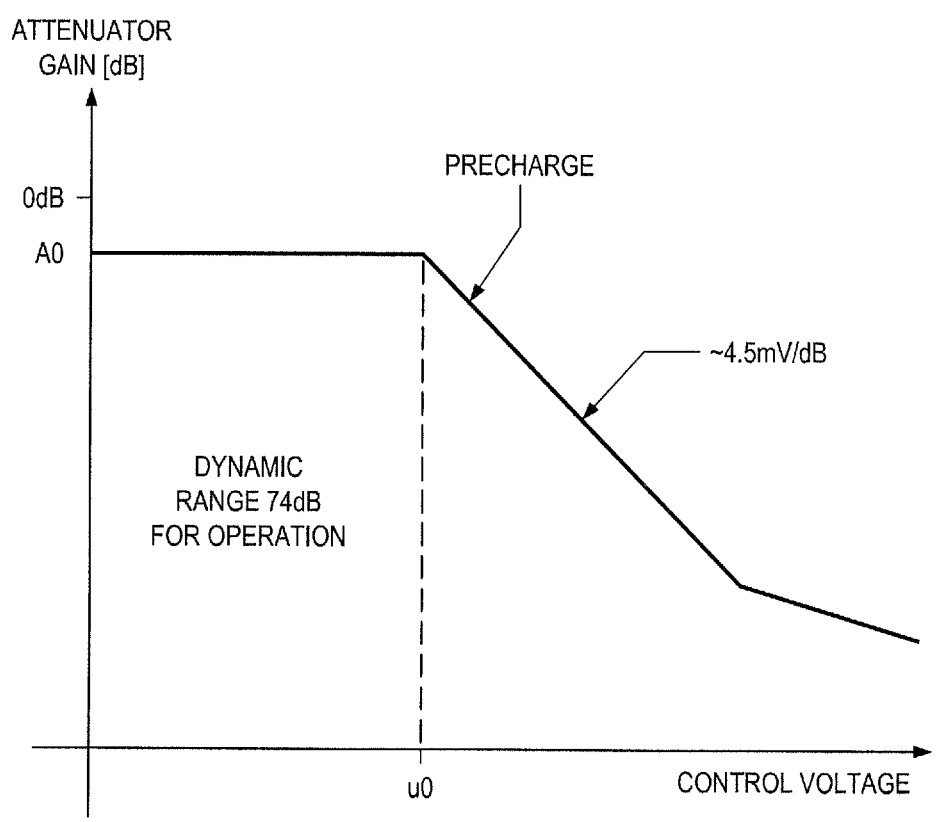
FIG. 5 is a schematic diagram illustrating the operation of an attenuator controller.

In state 0b, the attenuator controller ATTC is pre-charged (see FIG. 4). In FIG. 5, the relation between the attenuator gain and a control voltage that is fed to the attenuator controller ATTC is depicted. A pre-charge voltage u0 is necessary to set the attenuator controller ATTC to its linear range.

Figure 3:
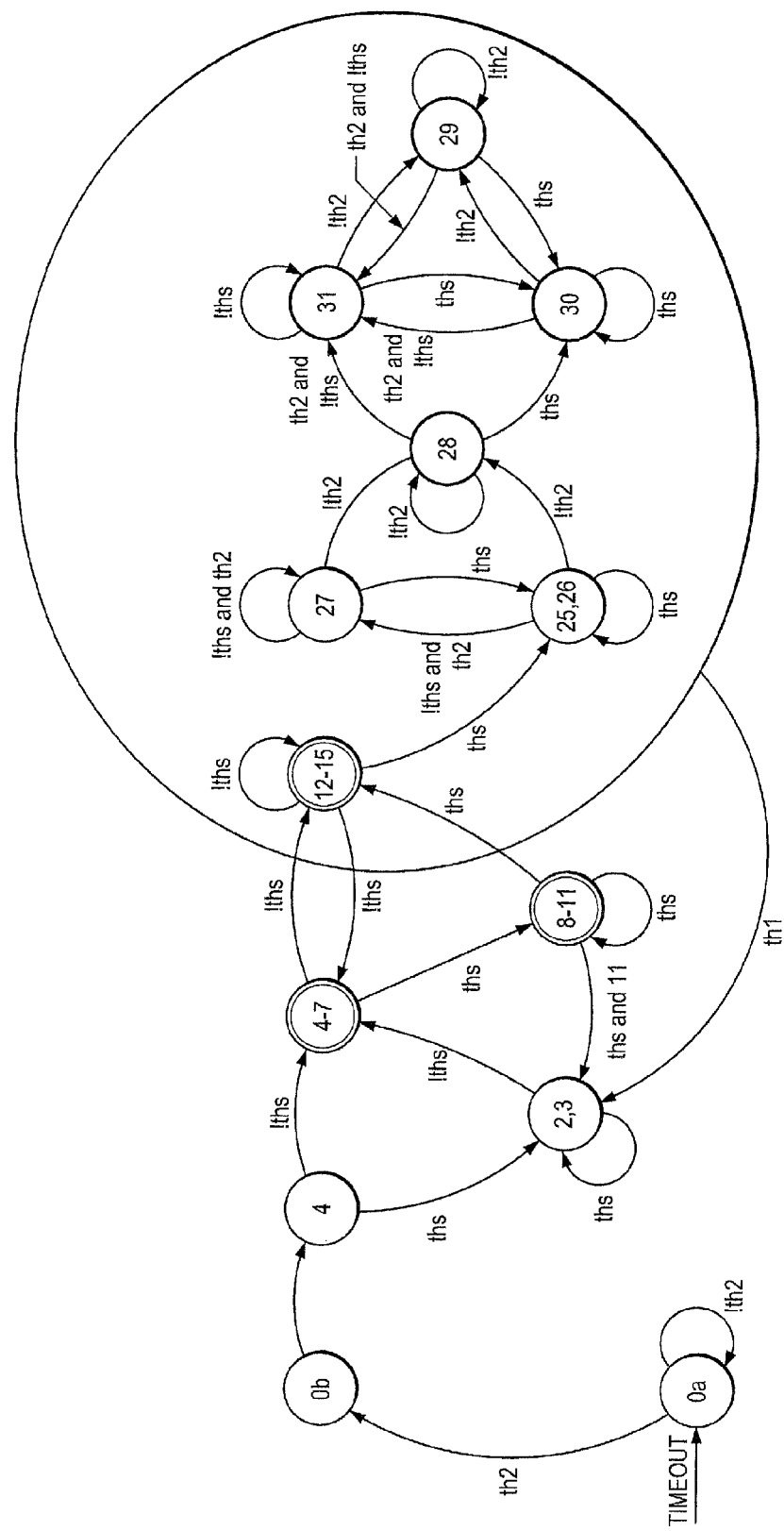
FIG. 3 is a state diagram for a control unit according to an embodiment of the invention.

After pre-chargement of the attenuator controller ATTC, the finite state machine FSM automatically changes to state 1 (see FIG. 3). The step size of the attenuator controller ATTC is set to big. However, both values for up and down remain at zero which means that neither an increase nor a decrease of the attenuator gain (see FIG. 4) takes place. Consequently, there is no change in the control voltage of the attenuator controller ATTC. The startup sequence is at an end and the finite state machine FSM changes into a settling mode.

In the settling mode, starting at state 1 it is determined first, whether the output voltage of the amplifier chain AMPC is higher or lower than THS. If the output voltage is higher than THS, the machine follows the branch ths and reaches state 2 and 3 (indicated by 2,3 in FIG. 3). In this state, the attenuator gain is reduced using big steps down (see FIG. 4) until the level of the RF signal is below THS. If this is the case, the machine follows the branch !ths to states 4 to 7 (indicated by 4-7 in FIG. 3). The attenuator gain is increased again with big steps up (which may be smaller than big steps down, further, they are half the size of the big steps down) until the level of the RF-signal is higher than THS.

Now, the attenuator gain will be decreased using medium steps in state 8 to 11 (indicated by 8-11). These steps are repeated until the level of the RF-signal falls below THS again. If this happens, the machine follows the branch !ths and reaches state 12 to 15 (12-15 in FIG. 3). Again, at this state, the attenuator gain will be increased with medium steps up (which again will be smaller than medium steps down).

The level of the RF-signal will reach the threshold THS. Then, the machine changes to states 25, 26. In these states, the step size is set to small (see FIG. 4). The gain settling of the RFID transponder is achieved and the rectifier output voltage oscillates around the THS level with a minimum attenuation step size until demodulation starts. In the following, further functionality of the finite state machine FSM will be explained by making reference to FIGS. 3 and 4.

State 2, 3 reduces the attenuator gain with big steps (see FIG. 4). Consequently, the transition to the next state, i.e. the branch !ths, is always reached. Therefore the steps 2, 3 do not need a timeout criterion. The input amplitude of the RF-signal is reduced until the signal level falls below THS.

The states reducing the attenuator gain with medium steps, i.e. the states 8 to 11, will also reach the transition to the branch !ths leading to states 12 to 15, since the attenuator gain is reduced until the signal level falls below THS. However, this can take a long number of cycles when a strong signal arrives, because the down steps in the respective states 8 to 11 are only of medium size (see FIG. 4). Advantageously, the number of cycles the state machine stays in this status, is limited. Preferably, the number of cycles is limited to four cycles. If this limit is reached, the state machine changes to state 2, 3 as indicated by the branch ths&11.

The states increasing the attenuator gain have no built-in end condition. However, even with maximum gain, the input level might not be sufficient for the RF-signal to exceed the threshold THS. This refers to states 4 to 7 and 12 to 15. In this case, the RF-signal is to weak to reach the threshold value THS, the number of cycles the machine stays in the respective states is limited. Again, the states are preferably limited to four cycles. If this limit is reached, the machine changes to state 2, 3. This is not indicated by a branch in FIG. 3 for clarity reasons. In case of an RF-signal drop, i.e. the RF-signal quickly loses intensity, the machine remains in the states 4 to 7 or 12 to 15 until the maximum number of cycles is reached. If this is the case, the machine is set to the initial state 0a or to state 4 to 7 respectively.

Due to internal amplifier noise or external interference signals, the decision in state 1, i.e. whether the RF-signal is above or below the threshold value THS, has a certain probability to be wrong. The state machine has to recover from such a wrong decision in the following states. Consequently, the allowed number of cycles for the finite state machine to remain in one state is determined by the ratio of the step size of the previous state and the current step size, taking a wrong decision into account.

The demodulation of the RF-signal starts when settling is achieved and the signal falls below THS (which indicates a strong burst signal). Now, the state machine is in state 28 and the gain is kept constant since the up and down values are both set to low. The signal run is set to high which starts the following digital circuitry.

When RF is turned on, the level rises above TH2 and the machine changes into states 30 and 31. In this state, the signal EOB (End of Burst) is set to low and depending on the value of the RF-signal (whether it exceeds THS or not) the gain is adjusted to the level of the RF-signal. These states correspond to the states 26 and 27, both having a small step size and changing the amplifier gain up and down. The signal EOB is used for a demodulation in the following digital circuitry.

When RF is turned off, the level falls below TH2 and the machine changes into state 29. In this state, EOB (end of burst) is set to high and the gain remains constant.

Timeouts during modulation are detected by the subsequent bit detector block and in case such a timeout is detected the front end 2 is set to the initial state 0a.

The RFID transponder according to the invention is non-sensitive/robust with respect to interference signals. If interference noise is present, the gain control adapts to the level of the interference signal and the finite state machine FSM remains in the states 25, 26 to 31. If a stronger signal arrives, having a strength that is sufficient to lead to an output signal of the rectifier of more than TH1, the demodulation mode is left and the machine changes to settling mode. In case of such a strong burst, the machine changes to state 29 having a very low amplifier gain. In this case, the following circuitry will detect a symbol exceeding a maximum length and thus reset the finite state machine FSM to a state 0a. This is indicated in FIG. 3 by the timeout arrow leading to the state 0a.

A further embodiment of the invention will be explained in the following by making reference to FIGS. 6 and 7.

In a typical environment for an RFID application, the RF signal comes from different spatial directions. This is indicated in FIG. 6 by signals RFx, RFy and RFz. An interference tolerant frontend of an RFID transponder according to the invention uses three independent channels, one channel for each spatial direction. If a strong interference noise is received from a first direction and a signal is received from another direction, the signal to noise ratio (S/N) is different for each input channel. In most cases at least one channel has a sufficiently high S/N to correctly detect the signal.

As each channel is able to detect a wake up pattern and to react on this, even if one or two other channel(s) are blocked by an interference signal, the RFID transponder can react correctly when receiving a wake up pattern by selecting the undisturbed channel for further RF communication. If one channel detects a wake up pattern, a respective signal wakeX, wakeY or wakeZ is communicated to the rest of the RFID system and its protocol circuitry is started for further communication.

However, according to this approach, three channels, namely channelX, channelY and channelZ have to be active for bit detection and wake up pattern detection. In comparison to a conventional design using just one channel, this could lead to increased power consumption.

The RFID transponder according to the invention provides a solution for a scenario when an interference source and the RF signal RFx, RFy and RFz are received from different spatial directions. The interference source may be strong enough to jam the RFID receiver. However, by evaluating the input RF signal independently for each spatial direction in three separate amplifiers, one amplifier channel can correctly detect an input signal even if another amplifier is blocked by the interfering signal. In conventional designs, the three parallel amplifier channels will lead to the disadvantage of increased power consumption. Since the invention provides an RFID transponder having very little power consumption, this drawback could be overcome. In other words, the low power design of the RFID transponder according to the invention allows the aforementioned parallel design having a receiver channel for each spatial direction.

Each channel comprises an automatic gain control AGC and a demodulator block 8. The amplification of the RF signal is controlled by a loop, so that the output signal amplitude of the AGC is constant. Preferably, a closed loop control according to the aforementioned embodiment of FIGS. 2 to 5 may be applied.

The demodulation block 8 detects, whether the input level exceeds a certain threshold level and outputs the ASK modulation. The data is preferably coded with a bit length coding, wherein the length of the low time plus high time corresponds to certain values. This may be measured in a bit detect block 10 using a local oscillator as time reference. For each symbol length a lower and an upper limit may be given, detected lengths, outside of the valid limits lead to an invalid symbol being output.

The output of the bit detect block 10 is subsequently coupled to a first stage of the wake up pattern detector WP START. Further, the signal is fed to a second block of the wake up pattern detector WP DETECT. The first stage WP START detects a start sequence of the wake up pattern. This start sequence is preferably concatenated to every wake pattern within the respective RFID system. The second stage WP DETECT detects a remainder of the wake up pattern that is concatenate to the start sequence. The resulting values of the wake up pattern detection are compared with the expected/predetermined wake up pattern.

The specific structure of the wake up pattern and the subsequent two stage wake up pattern detection is for minimizing power consumption of the RFID. To achieve a maximum power saving, the following implementation may be chosen. An example embodiment will be explained in the following:

In an initial state (absence of any signal) only the analog part of the RFID, i.e. the AGC and the demodulator 8 are active.

When an input signal RFx, RFy, RFz of sufficient strength is detected by the demodulation circuit 8, the bit detect circuit 10 and the first stage WP START of the wake up pattern detector is enabled.

If the input signal RFx, RFy, RFz drops below a certain threshold value for longer than a timeout time, the front end 2 returns to its initial state.

If the first stage WP START of the wake up pattern detector detects a valid start sequence, i.e. the first part of the wake up pattern, it enables and resets the second stage WP DETECT of the wake up pattern detector for further comparison of the incoming data with a remaining predetermined wake up pattern.

If the first stage WP START detects an invalid symbol, the second stage WP DETECT of the wake up pattern detector is disabled and the first stage WP START waits again for a valid start sequence, i.e. a valid wake up pattern.

If both the first stage WP START and the second stage WP DETECT of the wake up pattern detector detect a valid wake up pattern, a wake signal wakeX, wakeY or wakeZ is output, which activates the further parts of the RFID, e.g. the protocol circuitry. If the second stage WP DETECT however receives a symbol which does not match the expected value, it disables itself. The first stage WP START remains active and searches for a valid start sequence, i.e. a valid wake up pattern.

The wake up pattern detector, i.e., may be first stage WP START and second stage WP DETECT do not work with the same clock as the bit detect circuit 10, but with the symbol clock, which is generated by the bit detector 10. The frequency of the bit detect clock determines the resolution of the symbol discrimination and is usually much higher compared to the symbol clock, which is output whenever a symbol (including an invalid symbol) is detected. This aspect leads to a reduction in power consumption.

Figure 6:
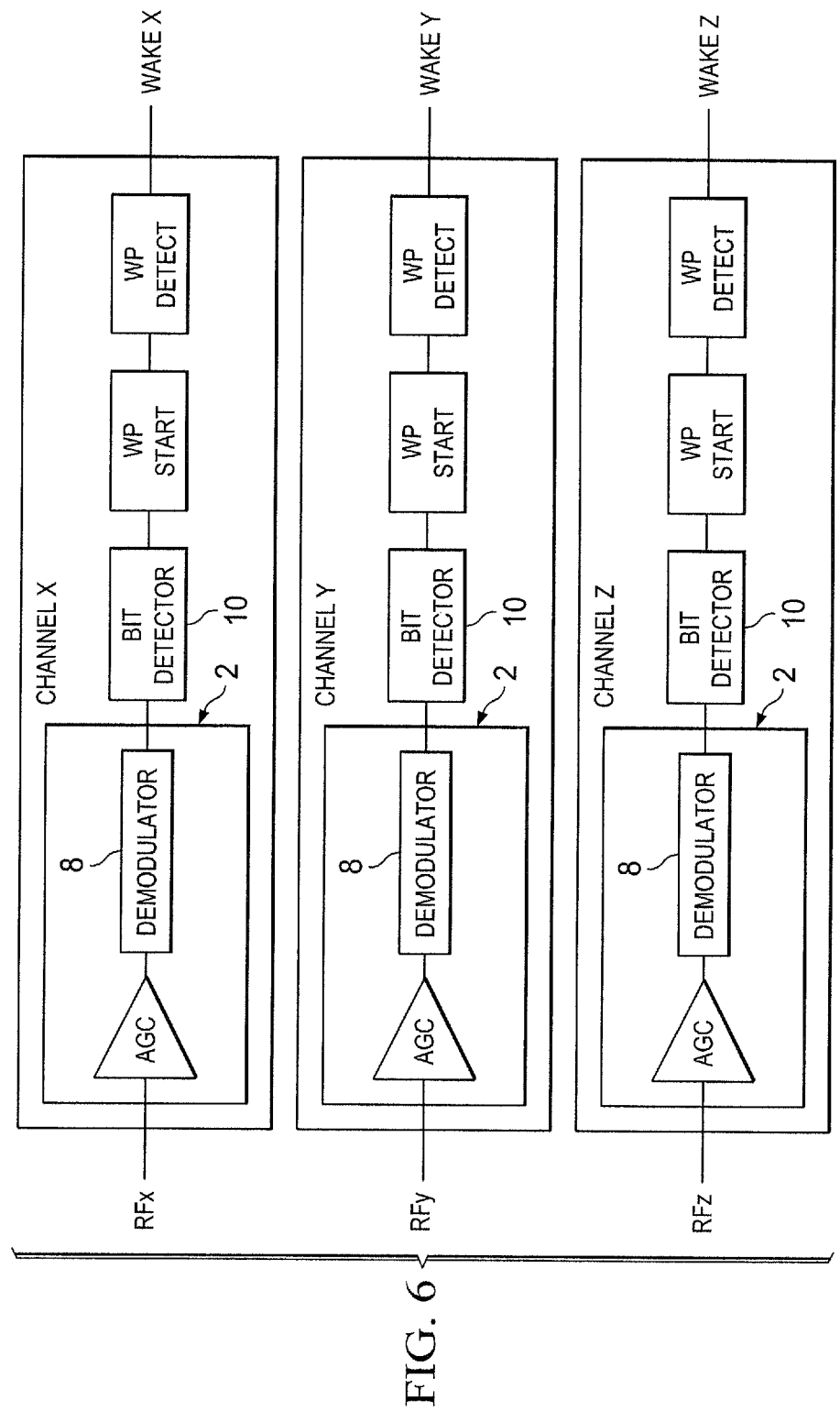
FIG. 6 is a simplified circuit diagram of three receiver channels having a two stage wake-up pattern detector.

This RFID layout according to the embodiment of FIG. 6 can be extended to support a multiple wake up pattern. This further embodiment will be explained by making reference to FIG. 7.

In some RFID applications, a base station can select the RFID transponder's response by sending different wake up patterns. For example, by sending a first wake up pattern, a fast but less secure authentication protocol for unlocking a car's door may be selected. In contrast, by sending a second wake up pattern a slower but more secure authentication protocol, e.g. for the engine start clearance is selected. The two wake up patterns have the same start sequence but different remainders.

Figure 1:
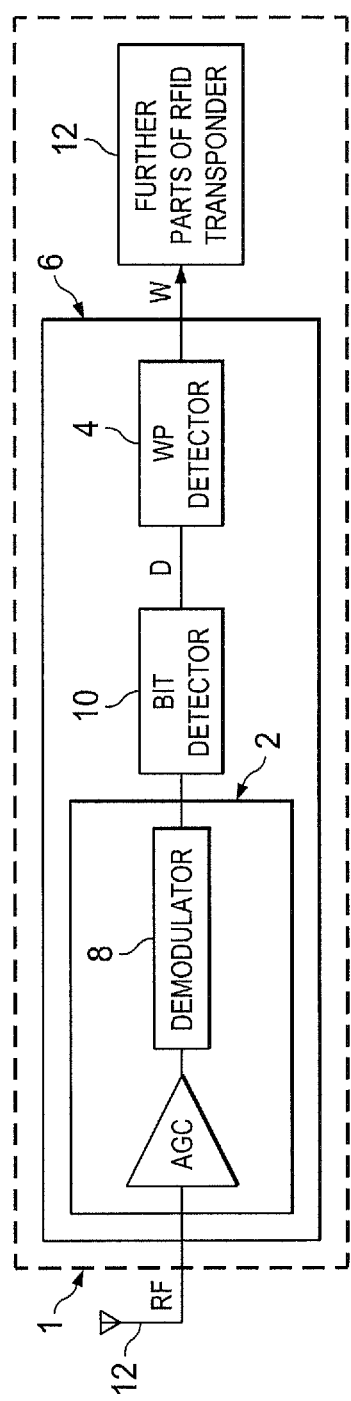
FIG. 1 is a schematic receiver channel.
Figure 7:
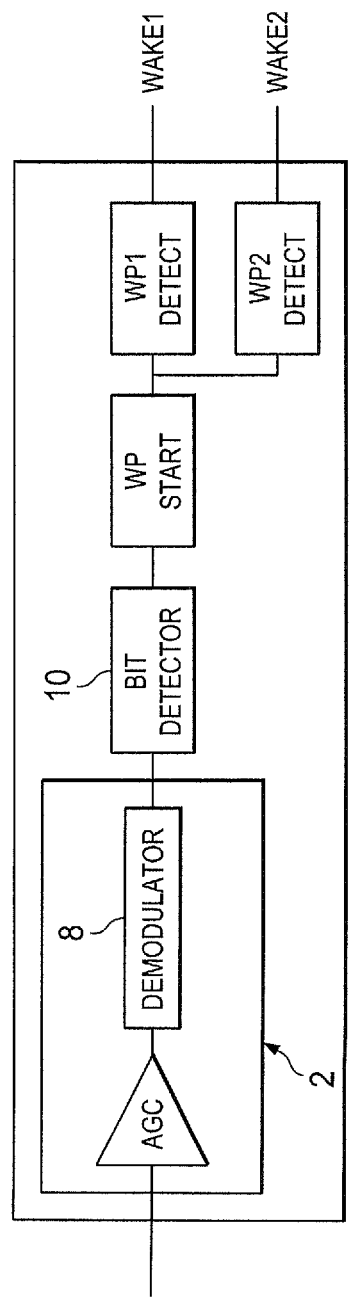
FIG. 7 is a simplified circuit diagram for a receiver channel, wherein the second stage wake-up pattern detector is split up.

The embodiment of FIG. 7 shows a wake up pattern detector having a single first stage WP START but two second stages, namely WP1 DETECT and WP2 DETECT. The latter ones detect the respective different remainders of the wake up pattern. Upon successful detection, the respective signal wake1 or wake2 are communicated to the rest of the RFID transponder.

Operation of the RFID transponder having a split up second stage is in analogy with the aforementioned sequence. The embodiment may be extended to more than two different remainders of a wake up pattern by solely adding further second stages for each wake pattern.

According to another aspect of the invention, for long wake patterns it is further advantageous to split up the second stage of the wake up pattern detector, e.g. a first stage WPdetect1 and a second stage WPdetect2. For an exemplary length of a wake up pattern remainder of N+M symbols, the first stage WPdetect1 will detect/compare the first N symbols of the wake pattern remainder. Upon successful comparison of the first N symbols, the second stage WPdetect2 is enabled which will detect/compare the last M symbols of the wake pattern remainder. In case of successful detection, a respective output signal wake is generated.

Although the invention has been described in detail, it should be understood that various changes, substitutions and alterations can be made thereto without departing from the spirit and scope of the invention as defined by the appended claims.

The invention claimed is:

1. An RFID transponder having an analog front end receiver comprising:
   an attenuator coupled to receive an RF-signal from an antenna and to attenuate the RF-signal;
   an amplifier having a fixed amplifier gain and being coupled to receive and to amplify the attenuated RF-signal;
   a control unit coupled to the attenuator control a gain of the attenuator, the control unit being configured to control the attenuator gain in response to a level of the amplified RF-signal and to have a plurality of predetermined states causing the attenuator to increase (step-up) or to decrease (step-down) its gain by a predefined step size, wherein the step size of a step-up is equal to or smaller than the step size of a step-down; and
   the control unit being configured to switch, upon reaching or exceeding a predefined threshold value, from a first state to a second state having a smaller step size and causing the attenuator to change the gain such that the slope of the RF signal inverts and to switch, upon reaching the predefined threshold again, to a third state causing the attenuator to change a prefix of the gain.

2. The RFID transponder according to claim 1, wherein the states of the control unit are classified in three groups, a first and a second group comprising at least a step-up and a step-down having a big or medium step size and a third group comprising at least a step-up and a step-down having a small step size.

3. The RFID transponder according to claim 2, wherein for a medium or a big step-down, the step size is bigger then the step size for a respective medium or big step-up, and wherein for small steps, the step size for a step-down is equal to the step size of a step-up.

4. The RFID transponder according to claim 3, wherein the step size of a big step-down is equal to:
   twice the step size of a big step-up,
   four times the step size of a medium step-down,
   eight times the step size of a medium step-up, and
   sixteen times the step size of a small step-up or step-down.

5. The RFID transponder according to claim 2, wherein the second group of states comprises at least two sub-groups of states each sub-group comprising at least a step-up and a step-down, wherein a first sub-group comprises steps-up and steps-down having a big step size and a second sub-group comprises steps-up and steps down having a medium step size, and wherein the control unit is configured to activate a respective step-down before activating the step-up, upon wake up of the RFID transponder.

6. The RFID transponder according to claim 5, wherein the control unit is further configured to activate the states having a big step size before activation of the states having a medium step size, upon wake up of the RFID transponder.

7. The RFID transponder according to claim 1, further comprising a peak detector coupled to detect a peak level of the amplified RF-signal and to communicate the peak level to the control unit, wherein the peak detector has a predetermined high and low detection speed, and wherein the states of the third group cause the peak detector to work at low detection speed.

8. The RFID transponder according to claim 1, wherein the control unit comprises an attenuator controller and a finite state machine for storing the plurality of states and for controlling the control unit by the states.

9. The RFID transponder according to claim 1, further comprising a vehicle entry system having an in-vehicle base station and a mobile unit, comprising the RFID transponder.

10. The RFID transponder according to claim 1, having an analog front end receiver for receiving a wake up pattern comprising a first and a second part concatenated to each other, the RFID transponder further having a wake up pattern detector comprising a first and a second stage, wherein the first stage has a lower power consumption compared to the second stage, and wherein the first stage is configured to detect the first part of the wake up pattern and upon detection to activate the second stage of the wake up pattern detector.

11. The RFID transponder according to claim 10, wherein upon failed detection of the first part of the wake up sequence, the wake up pattern detector is configured to return to a sleep mode.

12. The RFID transponder according to claim 10, wherein upon activation of the second part of the wake up pattern detector and failed detection of the second part of the wake up pattern, the wake up pattern detector is configured to deactivate its second stage and to leave the first stage activated.

13. Method of operating an RFID transponder having an analog front end receiver, the method comprising the steps of:
receiving an RF-signal from an antenna and attenuating the received RF-signal at the attenuator;
amplifying the attenuated RF-signal with an amplifier having a fixed amplifier gain;
controlling a gain of the attenuator with a control unit, wherein the attenuator gain is controlled in response to a level of the amplified RF-signal;
the attenuator gain is increased (step-up) or decreased (step-down) by a predefined step size, wherein the step size for increasing the attenuator gain is equal to or smaller than the step size for decreasing the attenuator gain; and
upon reaching or exceeding a predefined threshold value, the step size is decreased and the attenuator gain is changed such that the slope of the RF signal inverts and, upon reaching the predefined threshold again, the prefix of the amplifier gain is inverted.

* * * * *